United States Patent [19]

Kawano

[11] Patent Number: 5,759,266
[45] Date of Patent: Jun. 2, 1998

[54] METHOD FOR GROWING A CDTE LAYER ON A SI SUBSTRATE BY A MOLECULAR BEAM EPITAXY

[75] Inventor: Masaya Kawano, Tokyo, Japan

[73] Assignee: NEC Corporation, Tokyo, Japan

[21] Appl. No.: 538,451

[22] Filed: Oct. 3, 1995

[30] Foreign Application Priority Data

Oct. 3, 1994 [JP] Japan .................. 6-238800

[51] Int. Cl.$^6$ .................. C30B 25/18
[52] U.S. Cl. .................. 117/105; 117/84; 117/108; 117/954; 438/761; 438/763
[58] Field of Search .................. 437/126, 133; 117/84, 105, 108, 954; 438/761, 763

[56] References Cited

U.S. PATENT DOCUMENTS

| | | | |
|---|---|---|---|
| 5,229,333 | 7/1993 | Cho et al. | 437/235 |
| 5,382,542 | 1/1995 | Zinck et al. | 437/126 |
| 5,394,826 | 3/1995 | Ebe et al. | 117/956 |
| 5,399,206 | 3/1995 | De Lyon | 437/105 |

FOREIGN PATENT DOCUMENTS 62-212293  9/1987  Japan .................. 117/956

*Primary Examiner*—Robert Kunemund
*Attorney, Agent, or Firm*—Young & Thompson

[57] ABSTRACT

In a method for growing a CdTe layer on a clean surface of a Si substrate, the clean surface of the Si substrate is subjected to an irradiation of As at a temperature in the range of about 650° C. to about 800° C. so that Si atoms on terrace of the clean surface are replaced by As atoms, followed by carrying out a molecular beam epitaxy to grow a CdTe layer on the surface. It is preferable that the clean surface is subjected to an irradiation of Cd in addition to the irradiation of As.

56 Claims, 1 Drawing Sheet

METHOD FOR GROWING A CDTE LAYER ON A SI SUBSTRATE BY A MOLECULAR BEAM EPITAXY

BACKGROUND OF THE INVENTION

The present invention relates to a method for growing a CdTe layer on a Si substrate by a molecular beam epitaxy.

In one of the typical prior arts, the growth of a CdTe layer on a Si substrate by a molecular beam epitaxy is carried out after the removal of silicon oxide film from the surface of the silicon substrate. This method is, for example, disclosed in SPIE, Vol. 1512. By application of this method, a single domain CdTe (111) B has been grown on a Si(001) substrate tilted 1°, 2° and 4° toward |110|. The measured maximum full width at half maximum of x-ray double crystal rocking curves is 140 arc-s. This is disclosed in Journal of Electronic Materials, vol. 22, 1993, pp. 951–957.

However, this method is associated with the following problems. As described above, this method requires the removal of silicon oxide film from the surface of the silicon substrate prior to the growth of the CdTe layer on the silicon substrate. In order to remove the silicon oxide film, it is necessary to heat the silicon substrate to a temperature of not less than 850° C. This heat treatment causes the partial pressure of Te within the CdTe growth chamber to rise. This, in turn causes the surface of the silicon substrate to become polluted with Te before the CdTe layer is grown on the surface. The pollution of the surface of the silicon substrate with Te causes the surface to become chapped. When the CdTe layer is grown on a silicon substrate surface that is chapped and Te-polluted, it is difficult to obtain a high quality monocrystal structure. When the CdTe layer is grown on a Si(001) face with Te-pollution, a growth of a CdTe(111) A face appears on the Si(001) face. Such A-face is quite unsuitable for the growth of a CdTe layer thereon; it causes considerable difficulty in growing a CdTe layer with a monocrystal structure.

To prevent the above problems, it is necessary to increase the distance between the silicon substrate and an enclosure member such as an inner wall of the growth chamber which encloses the silicon substrate. The enlargement of the distance between them may contribute to a reduction in the degree of Te-pollution to the CdTe layer due to a reduction of degassfication generated from the enclosure member. To prevent the above problem, it is necessary to modify the growth chamber for the reduction of degassfication. However, it is difficult to conduct such modification of the growth chamber.

Another conventional method is disclosed in the Applied Physics Letters, vol. 63, 1993 pp. 818–820. In this method, a (001) off surface of Si substrate is subjected to a hydrogenated termination treatment so that any dangling bonds of silicon atoms of the Si substrate are terminated with H. According to this method, the process for cleaning the (001) off surface of the silicon substrate may be carried out within a reduced temperature range of 400° to 500° C. Subsequently, a ZnTe buffer layer is formed on a cleaned (001)off surface of the silicon substrate. Then, a CdTe (001)off epitaxial layer is grown on the ZnTe buffer layer, wherein the CdTe (001) off epitaxial layer has a Zn concentration of 4%. The measured full width at half maximum of x-ray double crystal rocking curves is 158 arc-s.

The above method, utilizing the hydrogenated termination treatment of the surface of the silicon substrate, has the following disadvantages. Whereas the cleaning temperature may be reduced to the relatively low range of 400° to 500° C., this temperature range is still higher than the growth temperature of the CdTe layer. This allows the problem described above with Te-pollution to remain. Namely, Te remains on the surface of the silicon substrate. If the cleaning process is carried out under the above range of from 400° C. to 500° C., then hydrogen bonded to silicon remains on the surface of the silicon substrate. The remaining hydrogen causes a deterioration of the crystal structure of the CdTe layer.

The above cleaning process may be carried out under conditions that suppress the pollution of the surface of the silicon substrate. This results in a difficulty in growing a desirable B-face CdTe crystal on the cleaned surface of the silicon substrate. In fact, the CdTe layers are grown in the A-face crystal growth on variable surfaces of the silicon substrate, for example, the (001) face, the (001) off face, the (112) face, the (112) off face, the (221) face and the (221) off face (110).

Still another conventional CdTe growth method has been known, wherein a Te-irradiation on the Si substrate is carried out prior to the CdTe growth on the Si substrate. According to this method, the B-face crystal growth on a Si (001) substrate is obtained, however, it is difficult to grow a high quality CdTe epitaxial layer on the Si (001). When the CdTe layer is grown on a Si (221) just or off substrate, it is difficult to obtain the B-face crystal growth of the CdTe layer.

Yet another conventional CdTe growth method has been known. A thin CdTe layer is grown on the Si substrate. Then, an optical irradiation onto the thin CdTe layer is carried out to cause a dissociation of Te atoms from the CdTe thin layer so that Cd atoms only remain on the Si substrate. Thereafter, the CdTe growth process is again commenced. It may be possible to grow the CdTe layer free from double domains on the Si substrate or a GaAs substrate. At the normal CdTe growth temperature, however, Cd atoms are not adhered on the Si substrate. Namely, at about 330° C. as the normal CdTe growth temperature it is, in fact, impossible to leave only Cd atoms on the Si substrate. In order to leave only the Cd atoms on the Si substrate, it is required that a Te atom or a heavy metal impurity resides as a core on the Si substrate. Even if the Cd atoms remain on the Si substrate, only the A-face CdTe is grown on the Si substrate. Even if the substrate temperature is lowered to adhere only Cd atoms on the Si substrate, the grown CdTe layer does not have a high quality crystal structure.

Under the above circumstances, it has been required to develop a quite novel method for growing a high quality CdTe epitaxial layer on various types of Si substrate by a molecular beam epitaxy.

SUMMARY OF THE INVENTION

Accordingly, it is an object of the present invention to provide a novel method for growing a CdTe layer on a Si substrate by a molecular beam epitaxy free from any problems or disadvantages as described above.

The above and other object, features and advantages of the present invention will be apparent from the following descriptions.

The present invention provides a method for growing a CdTe layer on a clean surface of a Si substrate, wherein the clean surface of the Si substrate is subjected to an irradiation of As at a temperature in the range of about 650° C. to about 800° C. so that Si atoms on terrace of the clean surface are replaced by As atoms, followed by carrying out a molecular beam epitaxy to grow a CdTe layer on the surface. It is preferable that the clean surface is subjected to an irradiation of Cd in addition to the irradiation of As.

BRIEF DESCRIPTIONS OF THE DRAWINGS

Preferred embodiments of the present invention will be described in detail with reference to the accompanying drawings.

DESCRIPTIONS OF THE INVENTION

Figure 1:
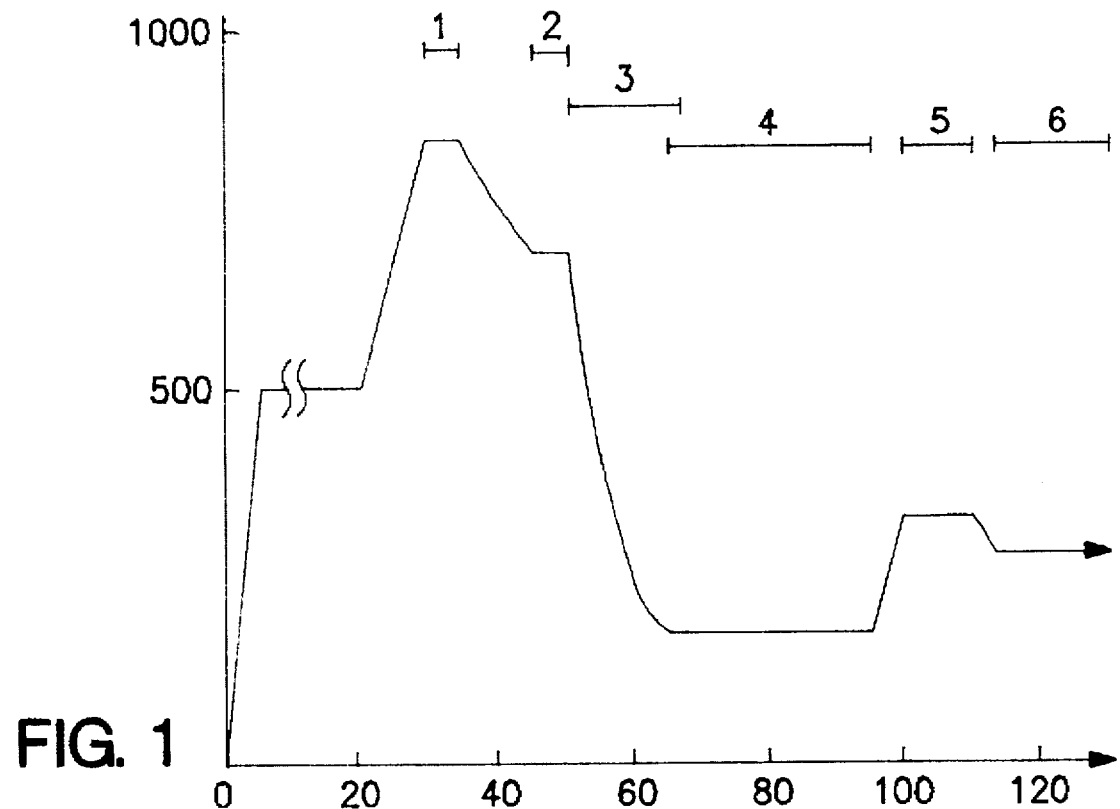
FIG. 1 is a diagram illustrative of variations of temperatures in steps involved in a process for growing a CdTe layer on a Si substrate by a molecular beam epitaxy according to the present invention.

In a method for growing a CdTe layer on a clean surface of a Si substrate according to the present invention, a clean surface of the Si substrate is subjected to an irradiation of As at a temperature in the range of about 650° C. to about 800° C. so that Si atoms on terraces of the clean surface are replaced by As atoms, followed by carrying out a molecular beam epitaxy to grow a CdTe layer on the surface. It is preferable that the clean surface is subjected to an irradiation of Cd in addition to the irradiation of As.

The irradiation of Cd may preferably be continued until the surface of the Si substrate is completely covered by CdTe compounds in the molecular beam epitaxy, while the irradiation of As is discontinued before the molecular beam epitaxy.

Available sources for the irradiation of As may include As metal, $AsH_3$, $As_2H_4$, $Cd_3As_2$ and $CdAs_2$. Available sources for the irradiation of Cd may include Cd metal and $CdH_3$.

Both the irradiations of Cd and As may be continued for 5 minutes at 750° C. under conditions that a dose of the irradiation of As is $2\times10^{-8}$ torr in a pressure conversion and a dose of the irradiation of Cd is $2\times10^{-6}$ torr in a pressure conversion.

The above novel molecular beam epitaxy according to the present invention is applicable to various types of Si substrates. For example, the available Si substrates have a (221) just face, a (221) face tilted toward [−1−1 4] at an angle in the range from 0° to 16°, particularly 3°, a (111) just face, a (001) just face, a (001) face tilted 1° toward [110], a (001) face tilted 4° toward [110], a (001) face tilted 8° toward [110], a (112) just face, and a (112) face tilted 3° toward [111⁻].

The CdTe layer may advantageously be grown by first and second CdTe irradiations with a time interval during which an annealing process is carried out. A dose of the first and second CdTe irradiation may be $1\times10^{-7}$ torr in a pressure conversion.

The irradiation of As may preferably be carried out at a temperature in the range of 700° C. to 750° C.

According to the present invention, there may be obtained a high quality B-face CdTe epitaxial layer on the Si substrate. It was, however, observed by use of a X-ray photoelectron spectroscope (XPS) that no Cd is adhered on a clean and As-coated surface of the Si substrate at a CdTe growth temperature of about 300° C. even if Cd is irradiated onto the surface. For that reason, it may be considered that atoms first bonded on the clean and As-coated surface of the Si substrate would be Te but not Cd. By use of a reflection high-energy diffraction (RHEED) or the X-ray photoelectron spectroscope (XPS), it was also confirmed that no Te was detected on the surface of the substrate which is heated up to a temperature in the range of about 650° C. to 800° C. This means that Te atoms were eliminated from the surface of the Si substrate. This is supported by the fact that the measured reflection high-energy diffraction (RHEED) pattern is sharp. By contrast, Te is adhered on the surface of the Si substrate with a temperature less than 650° C. This is supported by the fact that the measured reflection high-energy diffraction (RHEED) pattern is broad. In fact, a critical temperature of the Te-elimination tends to depend upon a Te-partial pressure. When the temperature of the Si substrate is risen up to more than 800° C., Te atoms are strongly bonded to Si atoms under the surface of the Si substrate. This is supported by the fact that, at the above temperature more than 800° C., the measured reflection high-energy diffraction (RHEED) pattern becomes spotty. The critical temperature for the Te-bonding to the Si atoms under the surface of the Si substrate tends to depend upon the Te-partial pressure. The increase in the Te-partial pressure drops the above critical temperature.

The As irradiation within the above Te-elimination temperature range causes Si atoms on terraces of the surface of the Si substrate to be replaced by As atoms. As a result, the terraces of the surface of the Si substrate are covered by an As monatomic layer. This may suppress an absorption of Te on the above terraces. The Cd irradiation within the above Te-elimination temperature range causes Te to be bonded or trapped to Cd thereby the Te-partial pressure is reduced. As a result, the surface of the Si substrate becomes free from the Te-pollution.

Figure 2:
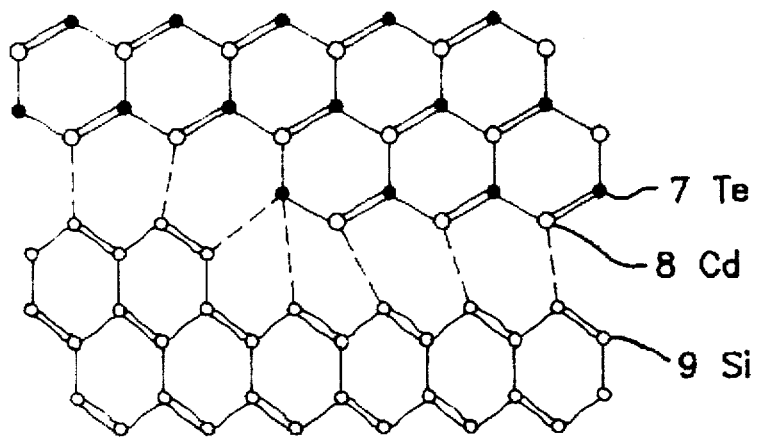
FIG. 2 is a view illustrative of crystal structures on an interface between a Si substrate and a CdTe layer grown thereon according to the present invention.

It was confirmed that when Cd and Te is irradiated onto the As-coated surface of the Si substrate, the B-face crystal growth of the CdTe layer is caused. As a result, the grown CdTe layer has a high quality crystal structure free of any crystal defect. Whereas the Cd irradiation may be discontinued after As covers the terraces of the surface of the Si substrate, it is more preferable to continue the Cd irradiation thereafter until the surface of the Si substrate is covered by CdTe. This reason will be described with reference to FIG. 2 which illustrates a Si (221) off face of the Si substrate. The Si (221) off face comprises terraces and a step. At first, Te atoms 7 are bonded to Si atoms 9 on the step of the Si (221) off face and further Cd atoms 8 are bonded to Si atoms 9 on the (111) terraces thereby the B-face is formed. If the Si (221) off face were subjected to a Te-atmosphere, the Te atoms 7 were bonded to the Si atoms 9 not only on the step but also on the terraces. As a result, the CdTe grown on the Te-coated surface of the Si substrate has an A-face crystal structure or a crystal structure including antiphase domains. This means that, in order to obtain the B-face CdTe crystal grown, it is required to prevent any bonding of Te atoms 7 to the Si atoms 9 on the terraces, even Te may be bonded to the Si atoms 9 at the step. This was confirmed by an experimental result that the CdTe layer grown on the Te-coated terrace has the A-face CdTe crystal structure.

Even when the As-coated terraces of the Si (221) off face are formed, the step of the Si (221) off face is coated by the Te atoms 7. The As atoms on the terraces prevents the Te-atoms bonding to the Si atoms 9 on the terrace, while those As atoms are replaced by the Cd atoms 8 wherein a Cd monatomic layer is grown to extend from the Te-coated step on the terraces. The Te-atoms 7 at the step serves as a growth core. It is required prevent the Te-bonding to the Si atoms 9 on the terraces until the terraces are completed covered by the Cd atoms 8 or the Cd-monatomic layer. For that reason, it is required to carry out the CdTe growth under a Cd-rich condition until the terraces, are completely covered by the Cd atoms 8 or the Cd monatomic layer. In order to obtain the Cd-rich condition, it is preferable to continue the Cd irradiation until the Cd atoms 8 or the Cd atomic layer covers the Si (111) terraces, while the As irradiation has already been discontinued when the CdTe irradiations are commenced. Practically, the Cd-irradiation may be continued until the CdTe growth on the Si (221) off face could be confirmed by use of the reflection high-energy diffraction (RHEED).

A first embodiment according to the present invention will be described with reference to FIG. 1, wherein the B-face CdTe layer is grown by a molecular beam epitaxy on the Si substrate with a (221) face off 3° toward [−1 −1 4]. The Si substrate was subjected to an RCA cleaning. This RCA cleaning technique is disclosed in RCA Review, vol. 31, 1970, p. 187. The Si substrate is then introduced into a growth chamber so that the Si substrate was maintained at a temperature of 500° C. for a few hours under an ultra vacuum pressure. Subsequently, the Si substrate is subjected to a heat treatment at a temperature of 850° C. for 5 minutes to remove any silicon oxide film from the surface of the Si substrate. The temperature of the Si substrate was dropped to 750° C. before the Si substrate was subjected to irradiations of As and Cd at 750° C. for 5 minutes. The irradiations of As and Cd was carried out under conditions that a dose of the irradiation of As is $2\times10^{-8}$ torr in a pressure conversion and a dose of the irradiation of Cd is $2\times10^{-6}$ torr in a pressure conversion. After the irradiations of As and Cd was discontinued, the temperature of the Si substrate was dropped to 180° C. Thereafter, the Si substrate was subjected to a first irradiation of CdTe at a temperature of 180° C. for 30 minutes under a condition that a dose of the irradiation of CdTe is $1\times10^{-7}$ torr in a pressure conversion. Subsequently, the Si substrate was subjected to an annealing at a temperature of 340° C. for 10 minutes. Then, the Si substrate was to a second irradiation of CdTe at a temperature of 290° C. under a condition that a dose of the irradiation of CdTe is $1\times10^{-7}$ torr in a pressure conversion.

The grown CdTe layer has a thickness of 8.4 micrometers. The measured full width at half maximum of x-ray double crystal rocking curves is 92 arc-s.

A second embodiment according to the present invention will be described, wherein the B-face CdTe layer is grown by a molecular beam epitaxy on the Si substrate with a (221) face off 3° toward [−1 −1 4]. The Si substrate was subjected to the RCA cleaning. The Si substrate was then maintained at a temperature of 500° C. for a few hours under an ultra vacuum pressure. The Si substrate was subjected to a heat treatment at a temperature of 850° C. for 5 minutes to remove any silicon oxide film atom a surface of said Si substrate. Subsequently, the Si substrate was subjected to irradiations of As and Cd at a temperature of 750° C. for 5 minutes. The irradiations of As and Cd was carried out under conditions that a dose of said irradiation of As is $2\times10^{-8}$ torr in a pressure conversion and a dose of said irradiation of Cd is $1\times10^{-6}$ torr in a pressure conversion. The temperature of said Si substrate was dropped from 750° C. to 180° C. during which said irradiation of Cd was maintained, while said irradiation of As was already discontinued. Then, the Si substrate was subjected to a first irradiation of CdTe at a temperature of 180° C. for 30 minutes under a condition that a dose of said irradiation of CdTe is $1\times10^{-7}$ torr in a pressure conversion. The irradiation of Cd is discontinued 1 minute after commencement of said first irradiation of CdTe. Thereafter, the Si substrate was subjected to an annealing at a temperature of 340° C. for 10 minutes. The Si substrate was then subjected to a second irradiation of CdTe at a temperature of 290° C. under a condition that a dose of said irradiation of CdTe is $1\times10^{-7}$ torr in a pressure conversion.

The grown CdTe layer has a thickness of 19.6 micrometers. The measured full width at half maximum of x-ray double crystal rocking curves is 68 arc-s.

Whereas modifications of the present invention will be apparent to a person having ordinary skill in the art, to which the invention pertains, it is to be understood that embodiments as shown and described by way of illustrations are by means intended to be considered in a limiting sense. Accordingly, it is to be intended to cover by claims all modifications which fall within the spirit and scope of the present invention.

What is claimed is:

1. A method for growing a CdTe layer on a clean surface of a Si substrate, said method comprising:

subjecting said clean surface of said Si substrate to an irradiation of As at a temperature in the range of about 650° C. to about 800° C. so that Si atoms on at least one terrace of said clean surface are replaced by As atoms;

subjecting said surface of said Si substrate to an irradiation of Cd; and carrying out a molecular beam epitaxy to grow a CdTe layer on said surface.

2. The method as claimed in claim 1, wherein said irradiation of Cd is continued until said surface of said Si substrate is completely covered by CdTe compounds in said molecular beam epitaxy, while said irradiation of As is discontinued before said molecular beam epitaxy.

3. The method as claimed in claim 1, wherein said irradiation of As is carried out by use of As metal as a source.

4. The method as claimed in claim 1, wherein said irradiation of As is carried out by use of $AsH_3$ as a source.

5. The method as claimed in claim 1, wherein said irradiation of As is carried out by use of $As_2H_4$ as a source.

6. The method as claimed in claim 1, wherein said irradiation of As is carried out by use of $Cd_3As_2$ as a source.

7. The method as claimed in claim 1 wherein said irradiation of As is carried out by use of $CdAs_2$ as a source.

8. The method as claimed in claim 1, wherein said irradiation of Cd is carried out by use of Cd metal as a source.

9. The method as claimed in claim 1, wherein said irradiation of Cd is carried out by use of $CdH_3$ as a source.

10. The method as claimed in claim 1, wherein both said irradiations of Cd and As are continued for 5 minutes at 750° C. under conditions that a dose of said irradiation of As is $2\times10^{-8}$ torr in a pressure conversion and a dose of said irradiation of Cd is $2\times10^{-6}$ torr in a pressure conversion.

11. The method as claimed in claim 1, wherein said surface of said Si substrate has a (221) just face.

12. The method as claimed in claim 1, wherein said surface of said Si substrate has a (221) face tilted toward [−1 −1 4] at an angle in the range from 0° to 16°.

13. The method as claimed in claim 1, wherein said surface of said Si substrate has a (111) just face.

14. The method as claimed in claim 1, wherein said surface of said Si substrate has a (001) just face.

15. The method as claimed in claim 1, wherein said surface of said Si substrate has a (001) face tilted 1° toward [110].

16. The method as claimed in claim 1, wherein said surface of said Si substrate has a (001) tilted 4° toward [110].

17. The method as claimed in claim 1, wherein said surface of said Si substrate has a (001) face tilted 8° toward [110].

18. The method as claimed in claim 1, wherein said surface of said Si substrate has a (112) just face.

19. The method as claimed in claim 1, wherein said surface of said Si substrate has a (112) face tilted 3° toward [111⁻].

20. The method as claimed in claim 1, wherein said CdTe layer is grown by first and second CdTe irradiations with a time interval during which an annealing process is carried out.

21. The method as claimed in claim 1, wherein said CdTe layer is grown under a condition that a dose of said first and second CdTe irradiation is $1\times10^{-7}$ torr in a pressure conversion.

22. The method as claimed in claim 1, wherein said irradiation of As is carried out at a temperature in the range of 700° C. to 750° C.

23. A method for growing a CdTe layer on a Si substrate, said method comprising:

cleaning said Si substrate;

maintaining said Si substrate at a temperature of 500° C. for plural hours under an ultra vacuum pressure;

subjecting said Si substrate to a heat treatment at a temperature of 850° C. for 5 minutes to remove any silicon oxide film from a surface of said Si substrate;

subjecting said Si substrate to irradiations of As and Cd at a temperature of 750° C. for 5 minutes, wherein a dose of said irradiation of As is $2\times10^{-8}$ torr in a pressure conversion and a dose of said irradiation of Cd is $2\times10^{-6}$ torr in a pressure conversion;

subjecting said Si substrate to a first irradiation of CdTe at a temperature of 180° C. for 30 minutes under a condition that a dose of said irradiation of CdTe is $1\times10^{-7}$ torr in a pressure conversion;

subjecting said Si substrate to an annealing at a temperature of 340° C. for 10 minutes; and subjecting said Si substrate to an irradiation of CdTe at a temperature of 290° C. under a condition that a dose of said irradiation of CdTe is $1\times10^{-7}$ torr in a pressure conversion.

24. The method as claimed in claim 23, wherein said irradiation of As is carried out by use of As metal as a source.

25. The method as claimed in claim 23, wherein said irradiation of As is carried out by use of $AsH_3$ as a source.

26. The method as claimed in claim 23, wherein said irradiation of As is carried out by use of $As_2H_4$ as a source.

27. The method as claimed in claim 23, wherein said irradiation of As is carried out by use of $Cd_3As_2$ as a source.

28. The method as claimed in claim 23, wherein said irradiation of As is carried out by use of $CdAs_2$ as a source.

29. The method as claimed in claim 23, wherein said irradiation of Cd is carried out by use of Cd metal as a source.

30. The method as claimed in claim 23, wherein said irradiation of Cd is carried out by use of $CdH_3$ as a source.

31. The method as claimed in claim 23, wherein said surface of said Si substrate has a (221) just face.

32. The method as claimed in claim 23, wherein said surface of said Si substrate has a (221) face tilted toward [−1 −1 4] at an angle in the range from 0° to 16°.

33. The method as claimed in claim 23, wherein said surface of said Si substrate has a (111) just face.

34. The method as claimed in claim 23, wherein said surface of said Si substrate has a (001) just face.

35. The method as claimed in claim 23, wherein said surface of said Si substrate has a (001) face tilted 1° toward [110].

36. The method as claimed in claim 23, wherein said surface of said Si substrate has a (001) tilted 4° toward [110].

37. The method as claimed in claim 23, wherein said surface of said Si substrate has a (001) face tilted 8° toward [110].

38. The method as claimed in claim 23, wherein said surface of said Si substrate has a (112) just face.

39. The method as claimed in claim 23, wherein said surface of said Si substrate has a (112) face tilted 3° toward [111⁻].

40. A method for growing a CdTe layer on a Si substrate, said method comprising:

cleaning said Si substrate;

maintaining said Si substrate at a temperature of 500° C. for plural hours under an ultra vacuum pressure;

subjecting said Si substrate to a heat treatment at a temperature of 850° C. for 5 minutes to remove any silicon oxide film from a surface of said Si substrate;

subjecting said Si substrate to irradiations of As and Cd at a temperature of 750° C. for 5 minutes, wherein a dose of said irradiation of As is $2\times10^{-8}$ torr in a pressure conversion and a dose of said irradiation of Cd is $1\times10^{-6}$ torr in a pressure conversion;

dropping said temperature of said Si substrate from 750° C. to 180° C. during which said irradiation of Cd is maintained, while said irradiation of As is discontinued;

subjecting said Si substrate to a first irradiation of CdTe at a temperature of 180° C. for 30 minutes under a condition that a dose of said irradiation of CdTe is $1\times10^{-7}$ torr in a pressure conversion, wherein said irradiation of Cd is discontinued 1 minute after commencement of said first irradiation of CdTe;

subjecting said Si substrate to an annealing at a temperature of 340° C. for 10 minutes; and subjecting said Si substrate to an irradiation of CdTe at a temperature of 290° C. under a condition that a dose of said irradiation of CdTe is $1\times10^{-7}$ torr in a pressure conversion.

41. The method as claimed in claim 40, wherein said irradiation of As is carried out by use of As metal as a source.

42. The method as claimed in claim 40, wherein said irradiation of As is carried out by use of $AsH_3$ as a source.

43. The method as claimed in claim 40, wherein said irradiation of As is carried out by use of $As_2H_4$ as a source.

44. The method as claimed in claim 40, wherein said irradiation of As is carried out by use of $Cd_3As_2$ as a source.

45. The method as claimed in claim 40, wherein said irradiation of As is carried out by use of $CdAs_2$ as a source.

46. The method as claimed in claim 40, wherein said irradiation of Cd is carried out by use of Cd metal as a source.

47. The method as claimed in claim 40, wherein said irradiation of Cd is carried out by use of $CdH_3$ as a source.

48. The method as claimed in claim 40, wherein said surface of said Si substrate has a (221) just face.

49. The method as claimed in claim 40, wherein said surface of said Si substrate has a (221) face tilted toward [−1 −1 4] at an angle in the range from 0° to 16°.

50. The method as claimed in claim 40, wherein said surface of said Si substrate has a (111) just face.

51. The method as claimed in claim 40, wherein said surface of said Si substrate has a (001) just face.

52. The method as claimed in claim 40, wherein said surface of said Si substrate has a (001) face tilted 1° toward [110].

53. The method as claimed in claim 40, wherein said surface of said Si substrate has a (001) tilted 4° toward [110].

54. The method as claimed in claim 40, wherein said surface of said Si substrate has a (001) face tilted 8° toward [110].

55. The method as claimed in claim 40, wherein said surface of said Si substrate has a (112) just face.

56. The method as claimed in claim 40, wherein said surface of said Si substrate has a (112) face tilted 3° toward [111⁻].

* * * * *